(12) United States Patent
Sjöland et al.

(10) Patent No.: US 11,677,405 B2
(45) Date of Patent: Jun. 13, 2023

(54) MULTIPLE PLL SYSTEM WITH COMMON AND DIFFERENCE MODE LOOP FILTERS

(71) Applicant: Telefonaktiebolaget LM Ericsson (publ), Stockholm (SE)

(72) Inventors: Henrik Sjöland, Lund (SE); Staffan Ek, Lund (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 17/783,177

(22) PCT Filed: Dec. 20, 2019

(86) PCT No.: PCT/EP2019/086845
§ 371 (c)(1),
(2) Date: Jun. 7, 2022

(87) PCT Pub. No.: WO2021/121637
PCT Pub. Date: Jun. 24, 2021

(65) Prior Publication Data
US 2023/0013565 A1    Jan. 19, 2023

(51) Int. Cl.
*H03L 7/093*      (2006.01)
*H03L 7/07*       (2006.01)
(Continued)

(52) U.S. Cl.
CPC ............... *H03L 7/093* (2013.01); *H03L 7/07* (2013.01); *H03L 7/099* (2013.01); *H03L 7/22* (2013.01)

(58) Field of Classification Search
CPC ..... H04L 2027/0063; H04L 2027/0067; H04L 2027/0069; H04L 2027/0071;
(Continued)

(56) References Cited

U.S. PATENT DOCUMENTS 5,329,251 A    7/1994  Llewellyn
5,909,474 A    6/1999  Yoshizawa
(Continued)

FOREIGN PATENT DOCUMENTS

EP    0780985 A1    6/1997
EP    2264903 A1   12/2010
(Continued)

OTHER PUBLICATIONS

Agrawal, A. et al., "A Scalable 28GHz Coupled-PLL in 65nm CMOS with Single-Wire Synchronization for Large-Scale 5G mm-Wave Arrays", 2016 IEEE International Solid-State Circuits Conference, Digest of Technical Papers, Feb. 1, 2016, pp. 38-40, IEEE.
(Continued)

*Primary Examiner* — Diana J. Cheng
(74) *Attorney, Agent, or Firm* — Coats & Bennett, PLLC (57) ABSTRACT

A plurality of Phase Locked Loops, PLL (12, 14), are distributed across an Integrated Circuit, each receiving a common reference signal (A). A local phase error (B) of each PLL (12, 14) is connected to a phase error averaging circuit (16), which calculates an average phase error (C), and distributes it back to each PLL (12, 14). In each PLL (12, 14), two loop filters (20, 22) with different bandwidths are deployed. A lower bandwidth, high DC gain, common mode loop operates on the average phase error, and forces the PLL outputs (H) to track the phase of the common reference signal. A high bandwidth, difference mode loop operates on the difference between the local phase error (B) and the average phase error (C) to suppress phase differences between PLL outputs, minimizing interaction between them. The reference noise contribution at the output is controlled by the common mode loop, which can have a low bandwidth. The reference noise contribution and oscillator interaction suppression are thus independently controlled.

19 Claims, 6 Drawing Sheets

(51) Int. Cl.
*H03L 7/099* (2006.01)
*H03L 7/22* (2006.01)

(58) Field of Classification Search
CPC ..... H04L 2027/0073; H04L 2027/0075; H04L 2027/0079; H04L 2027/0081; H04L 2027/0083; H04L 2027/0097; H04L 2027/0085; H03L 7/093; H03L 7/085
See application file for complete search history.

(56) References Cited

U.S. PATENT DOCUMENTS

| | | |
|---|---|---|
| 5,943,380 A | 8/1999 | Marchesani et al. |
| 5,977,806 A | 11/1999 | Kikuchi |
| 6,314,074 B1 | 11/2001 | Kuribayashi |
| 6,337,891 B1 | 1/2002 | Kim |
| 7,860,190 B2 * | 12/2010 | Feller ................ H04L 7/0029 375/326 |
| 8,406,366 B2 | 3/2013 | Hattori et al. |
| 8,415,999 B2 | 4/2013 | Ding et al. |
| 9,225,507 B1 | 12/2015 | Lye et al. |
| 10,931,498 B1 * | 2/2021 | Dorosenco ............. H03L 7/087 |
| 2008/0232531 A1 | 9/2008 | Feller |
| 2010/0102889 A1 | 4/2010 | Azenkot et al. |
| 2019/0131979 A1 | 5/2019 | Nilsson |
| 2021/0044472 A1 | 2/2021 | Dorosenco et al. |
| 2022/0085821 A1 | 3/2022 | Gao |

FOREIGN PATENT DOCUMENTS

| | | |
|---|---|---|
| EP | 2819131 A1 | 12/2014 |
| EP | 2843839 A1 | 3/2015 |
| EP | 2843839 B1 | 3/2020 |
| TW | 201225544 A | 6/2012 |

OTHER PUBLICATIONS

Anand Iyer, S.P. et al., "Phase-frequency synthesis using PLL-networks", 2008 Joint 6th International IEEE Northeast Workshop on Circuits and Systems and TAISA Conference, Jun. 22, 2008, pp. 5-8, IEEE.

* cited by examiner

MULTIPLE PLL SYSTEM WITH COMMON AND DIFFERENCE MODE LOOP FILTERS

TECHNICAL FIELD

The present invention relates generally to periodic signal circuits, and in particular to a system of distributed Phase Locked Loops having common and difference loop filters that improve phase noise and performance.

BACKGROUND

Wireless communication networks, including network nodes and radio network devices such as cellphones and smartphones, are ubiquitous in many parts of the world. These networks continue to grow in capacity and sophistication. To accommodate both more users and a wider range of types of devices that may benefit from wireless communications, the technical standards governing the operation of wireless communication networks continue to evolve. The fourth generation of network standards has been deployed (4G, also known as Long Term Evolution, or LTE), and the fifth generation is in development (5G, also known as New Radio, or NR).

One important development in modern wireless communication networks is the use of spatial diversity and/or spatial multiplexing. Spatial diversity refers to transmitting the same signal on different propagations paths (e.g., different transmit/receive antennas), which increases robustness against fading, co-channel interference, and other deleterious effects of RF signal transmission. Spatial multiplexing also uses multiple transmit and receive antennas, and refers to transmitting different portions of data on different propagation paths, using space-time coding, to increase data rates. These techniques are collectively referred to as Multiple Input, Multiple Output, or "MIMO." The key to all MIMO techniques is the deployment of multiple antennas, on at least one and preferably both sides of the air interface channel. 4G network standards contemplate 2, 4, or 8 antennas per transceiver; however, 5G networks currently being defined envision up to 128 antennas per transceiver. In highly parallel architectures, each antenna used to transmit or receive an RF signal is associated with a dedicated transceiver. Each transceiver requires a Local Oscillator (LO) signal to perform frequency conversion between carrier frequencies (for transmission/reception) and baseband (for signal processing). For efficient, low power processing of received signals, and for the transmission of coherent signals from multiple antennas, phase coherence of the multiple LO signals is important.

Another advanced feature of modern wireless communication networks is beamforming, wherein the directionality of an RF transmission is increased and controlled to "aim" in a specific direction. This may be accomplished by the use of a phased-array antenna comprising a large plurality of antenna elements. The relative phases of transmit signals sent to each antenna element are controlled to create constructive or destructive interference, thus amplifying the signal at some antenna elements and attenuating it at others, and hence controlling the direction in which the beam is transmitted. Similar phase manipulation of signals from antenna elements in a receive antenna can also result in beamforming the sensitivity of a phased-array antenna in receiving signals. In such beamforming systems, the LO signals at each antenna element transceiver must be phase-aligned, to allow for precise control of the phase offsets.

Typically, an LO signal is generated using a phase locked loop (PLL). A PLL is a well-known circuit, in which a Controlled Oscillator (i.e., an analog Voltage Controlled Oscillator, VCO, or Digital Controlled Oscillator, DCO) generates a high-frequency periodic signal, such as an LO signal. The generated periodic signal is at a frequency that is a predetermined multiple of a reference signal, such as a clock signal from a crystal oscillator or other accurate source. In a feedback loop within the PLL, a Phase Detector compares a frequency-divided version of the VCO/DCO output signal with the reference signal, to generate an error signal indicative of phase deviation. The error signal is processed by a loop filter, providing an input to the VCO/DCO that keeps the output signal phase-locked to the reference signal.

As indicated above, a PLL may operate in the analog or digital domain. Advantages of a digital PLL include the absence of large area capacitors in the analog loop filter, and the possibility to support advanced digital algorithms, such as to implement high-speed frequency hops. On the other hand, advantages of an analog PLL include reduced design complexity, and excellent phase noise. As one example of the design trade-offs, the simplicity of an analog PLL makes it an excellent choice at very high frequencies or for very low power. However, this choice sacrifices the possibility for digital algorithms to achieve improved performance. Regardless of the PLL architecture selected, however, a key concern is achieving sufficiently low phase noise, with limited power consumption and chip area, without sacrificing performance in other aspects.

Whether an analog or digital PLL architecture is selected, there are different options for distributing an LO signal to a large number of transceivers across an Integrated Circuit (IC). One option is to employ a single, very high performance PLL, and distribute one LO signal over the IC to each transceiver. Another option is to provide a separate PLL at each transceiver. Numerous intermediate options are possible, in which two or more distributed PLLs each provide an LO signal to some number of nearby transceivers. Each design option has advantages and disadvantages.

A single PLL provides the advantages of providing correlated phase noise to all transceivers, and no deleterious effects from the interaction of multiple PLLs operating at the same frequency. However, the noise performance of a single PLL then becomes stringent, and routing a high-frequency LO signal presents numerous known challenges (e.g., high power consumption, and maintaining frequency and phase match through multiple buffers).

There are several advantages to the use of multiple PLLs (whether one per transceiver or one per multiple transceivers). Their phase noises are non-correlated, other than noise originating from the common reference signal. Hence, the phase noise requirement of each PLL can be relaxed, and sufficient system performance can still be achieved when the signals are combined by their use in different transceivers. Although the total power consumption of multiple PLLs may be on par with that of a single PLL, considerable power consumption reduction can be realized by eliminating the LO distribution network. Furthermore, elimination of the LO distribution network makes the entire design more modular, allowing for the addition or removal of PLLs with minimal design effort. On the other hand, the use of multiple PLLs raises a risk of undesired interaction between them, particularly in cases where the IC is so compact that distances between the inductors of the oscillators are limited.

The Background section of this document is provided to place embodiments of the present invention in technological and operational context, to assist those of skill in the art in understanding their scope and utility. Approaches described in the Background section could be pursued, but are not necessarily approaches that have been previously conceived or pursued. Unless explicitly identified as such, no statement herein is admitted to be prior art merely by its inclusion in the Background section.

SUMMARY

The following presents a simplified summary of the disclosure in order to provide a basic understanding to those of skill in the art. This summary is not an extensive overview of the disclosure and is not intended to identify key/critical elements of embodiments of the invention or to delineate the scope of the invention. The sole purpose of this summary is to present some concepts disclosed herein in a simplified form as a prelude to the more detailed description that is presented later.

According to embodiments of the present invention described and claimed herein, a plurality of Phase Locked Loops (PLL) are distributed across an Integrated Circuit, for example to provide Local Oscillator signals to a plurality of transceivers. A common reference signal is distributed to all the PLLs. A signal indicative of the phase error of each PLL (the error between its output signal and a common reference signal) is connected to a phase error averaging circuit, which calculates an average, or common, phase error of all PLLs. The average phase error is distributed back to each PLL. In each PLL, two loop filters with different bandwidths are deployed. A lower bandwidth, high DC gain, common mode loop operates on the average phase error, and forces the PLL outputs to track the phase of the common reference signal. A high bandwidth, difference loop operates on the difference between the local phase error and the average phase error to suppress phase differences between PLL outputs, minimizing interaction between them and resulting in all distributed PLLs essentially acting as one PLL. In this system, interaction between PLL oscillators is suppressed, due to the high bandwidth in the difference mode loop. The reference noise contribution at the output is controlled by the common mode loop, which can have a low bandwidth, and hence the trade-off between reference noise contribution and oscillator interaction suppression is broken. The phase noise of PLLs using this technique is improved compared to conventional PLLs. By effectively parallel connecting the PLLs, both in-band and out-of-band phase noise benefit, up to the difference loop bandwidth.

One embodiment relates to a multi-PLL system implemented on an Integrated Circuit. The system includes two or more Phase Locked Loop (PLL) circuits and a phase error averaging circuit. Each PLL circuit is configured to receive a common reference signal and to output both an output signal and a local phase error signal. Each PLL circuit includes a Controlled Oscillator (CO), configured to generate the output signal in response to a CO control input; a phase detector configured to generate the local phase error signal by comparing the phase of the output signal or a divided output signal and the common reference signal; a common mode loop filter configured to generate a common mode CO control signal based on an average phase error of a plurality PLLs; and a difference mode loop filter configured to generate a difference mode CO control signal based on a difference between the PLL's local phase error signal and the average phase error of a plurality PLLs. The CO control input is a combination of the common mode CO control signal and the difference mode CO control signal. The phase error averaging circuit is configured to receive local phase error signals from a plurality PLLs; calculate an average phase error of the plurality of PLLs; and output the average phase error to two or more PLLs.

Another embodiment relates to a method of generating a two or more periodic signals using two or more PLLs, implemented on an Integrated Circuit. Each PLL receives a common reference signal. A local phase error signal is generated at each PLL. The local phase error signal indicates a phase error between the PLL output signal or a divided output signal and the common reference signal. The local phase error signals from a plurality of PLLs are averaged to generate an average phase error. At each of a plurality of PLLs, a common mode loop filter is operated with the average phase error as input, to generate a common mode Controlled Oscillator (CO) control signal; a difference mode loop filter is operated with a difference between the PLL's local phase error signal and the average phase error as input, to generate a difference mode CO control signal; and a CO is operated, with a combination of the common mode CO control signal and the difference mode CO control signal as a CO control input, to generate and output a periodic signal that is phase locked to the common reference signal and has low phase difference with other PLLs in the plurality.

Yet another embodiment relates to an Integrated Circuit (IC) having a multi-PLL system of generating a plurality of phase-locked periodic signals. The IC includes two or more Phase Locked Loop (PLL) circuits and a phase error averaging circuit. Each PLL circuit is configured to receive a common reference signal and to output both an output signal and a local phase error signal. Each PLL circuit includes a Controlled Oscillator (CO), configured to generate the output signal in response to a CO control input; a phase detector configured to generate the local phase error signal by comparing the phase of the output signal or a divided output signal and the common reference signal; a common mode loop filter configured to generate a common mode CO control signal based on an average phase error of a plurality PLLs; and a difference mode loop filter configured to generate a difference mode CO control signal based on a difference between the PLL's local phase error signal and the average phase error of a plurality PLLs. The CO control input is a combination of the common mode CO control signal and the difference mode CO control signal. The phase error averaging circuit is configured to receive local phase error signals from a plurality PLLs; calculate an average phase error of the plurality of PLLs; and output the average phase error to two or more PLLs.

Still another embodiment relates to a base station operative in a wireless communication network. The base station includes one or more transceiver circuits. The transceiver circuits include two or more Phase Locked Loop (PLL) circuits and a phase error averaging circuit. Each PLL circuit is configured to receive a common reference signal and to output both an output signal and a local phase error signal. Each PLL circuit includes a Controlled Oscillator (CO), configured to generate the output signal in response to a CO control input; a phase detector configured to generate the local phase error signal by comparing the phase of the output signal or a divided output signal and the common reference signal; a common mode loop filter configured to generate a common mode CO control signal based on an average phase error of a plurality PLLs; and a difference mode loop filter configured to generate a difference mode CO control signal based on a difference between the PLL's local phase error signal and the average phase error of a plurality PLLs. The CO control input is a combination of the common mode CO control signal and the difference mode CO control signal. The phase error averaging circuit is configured to receive local phase error signals from a plurality PLLs; calculate an average phase error of the plurality of PLLs; and output the average phase error to two or more PLLs.

Still another embodiment relates to User Equipment (UE) operative in a wireless communication network. The UE includes one or more transceiver circuits. The transceiver circuits include two or more Phase Locked Loop (PLL) circuits and a phase error averaging circuit. Each PLL circuit is configured to receive a common reference signal and to output both an output signal and a local phase error signal. Each PLL circuit includes a Controlled Oscillator (CO), configured to generate the output signal in response to a CO control input; a phase detector configured to generate the local phase error signal by comparing the phase of the output signal or a divided output signal and the common reference signal; a common mode loop filter configured to generate a common mode CO control signal based on an average phase error of a plurality PLLs; and a difference mode loop filter configured to generate a difference mode CO control signal based on a difference between the PLL's local phase error signal and the average phase error of a plurality PLLs. The CO control input is a combination of the common mode CO control signal and the difference mode CO control signal. The phase error averaging circuit is configured to receive local phase error signals from a plurality PLLs; calculate an average phase error of the plurality of PLLs; and output the average phase error to two or more PLLs.

BRIEF DESCRIPTION OF THE DRAWINGS

The present invention will now be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. Like numbers refer to like elements throughout.

DETAILED DESCRIPTION

For simplicity and illustrative purposes, the present invention is described by referring mainly to an exemplary embodiment thereof. In the following description, numerous specific details are set forth in order to provide a thorough understanding of the present invention. However, it will be readily apparent to one of ordinary skill in the art that the present invention may be practiced without limitation to these specific details. In this description, well known methods and structures have not been described in detail so as not to unnecessarily obscure the present invention.

Figure 1:
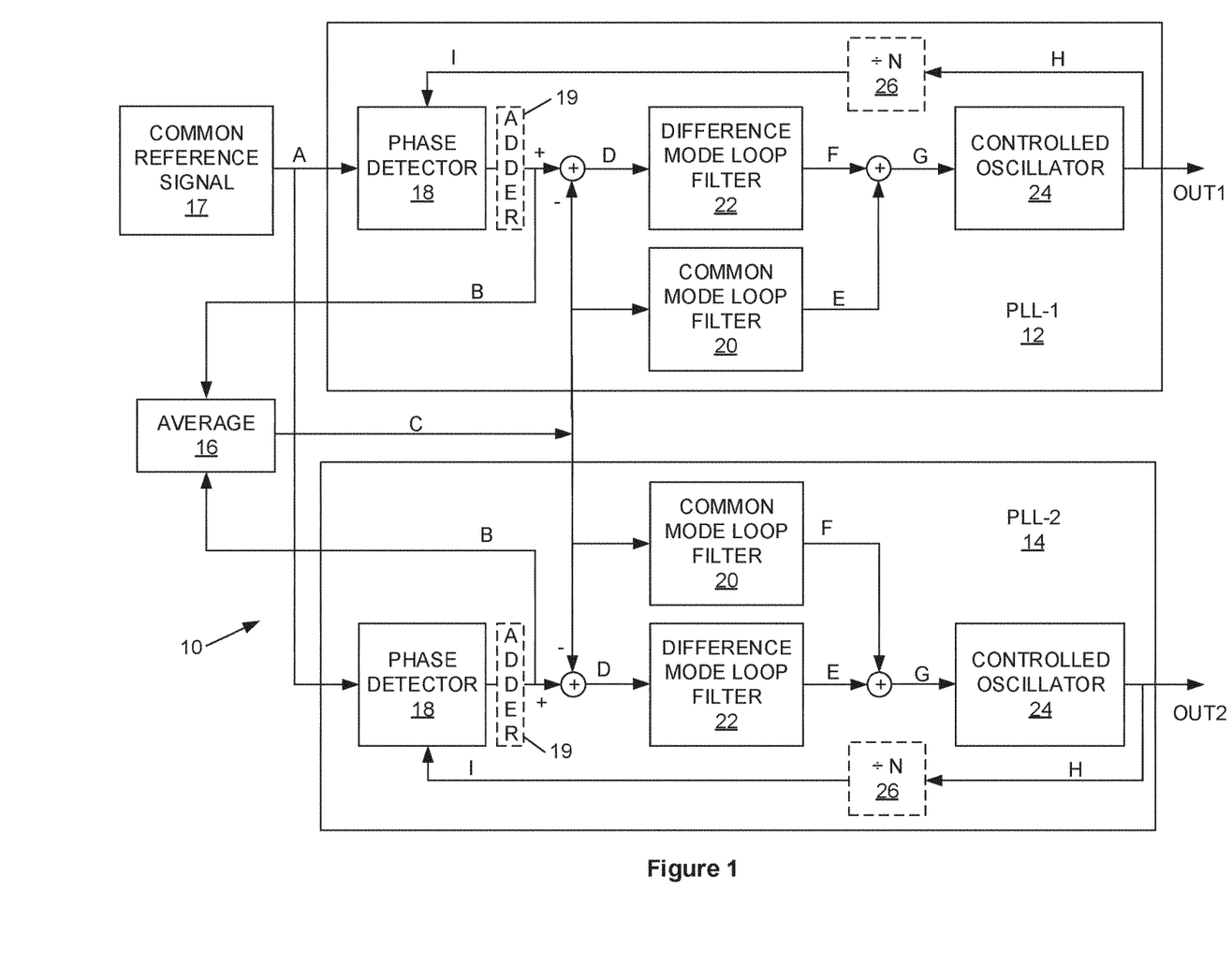
FIG. 1 is a block diagram of distributed PLLs on an IC.

FIG. 1 depicts a block diagram of an apparatus 10 implemented on an Integrated Circuit. The apparatus comprises two (or more) Phase Locked Loop (PLL) circuits PLL-1 12 and PLL-2 14, phase error averaging circuit 16, and a common reference signal source 17. Each PLL 12, 14 comprises a phase detector 18 (also known as a phase/frequency detector, PFD), a common mode loop filter 20, a difference mode loop filter 22, a Controlled Oscillator (CO) 24, and optionally (as indicated by the dashed lines) a divider 26. In embodiments where the PLL output frequency is a multiple of the common reference signal, the phase of the CO 24 output may be sampled with the reference signal and no divider 26 is required. An adder 19 at the output of the phase detector 18 may optionally (as indicated by the dashed lines) be used to provide a desired phase offset for some PLLs 12, 14, as described further herein. Each PLL 12, 14 operates conventionally, except that it has two loop filters 20, 22, the outputs of which combine to form the CO 24 control input.

The CO 24, which may for example comprise an analog Voltage Controlled Oscillator (VCO) or Digital Controlled Oscillator (DCO), generates a periodic output signal H in response to a CO control input G. The output signal H is divided by a predetermined value by the divider circuit 26. The divider 26 may be an integer divider, or may alternatively or additionally comprise a fractional divider, such as a delta-sigma modulator. The phase detector 18 compares the divided output signal I to the common reference signal, and outputs a phase error signal B indicating a phase error between the two. The common mode loop filter 20 and difference mode loop filter 22 operate as described further herein, each generating a CO control signal E, F. These CO control signals E, F are combined to generate a CO control input G, which controls the operation of the CO 24, locking it to frequency that is a multiple of the common reference signal A, and phase locked to the common reference signal A.

In one embodiment, the common reference signal source 17 generates a common reference signal A that is at a higher frequency than typically input to PLLs, for example from 100 MHz to 4 GHz, to allow a high bandwidth in the difference mode loops 22. This provides superior rejection of undesired interaction between oscillators 24 due to coupling, and it suppresses uncorrelated noise between oscillators 24 up to a higher frequency offset. At offset frequencies where the difference mode loop gain is high, the PLLs 12, 14 will lock to a common mode and then behave as a single PLL with the phase noise improved by 10·log(N) dB compared to a single PLL, where N is the number of participating PLLs 12, 14.

As mentioned above, the phase detector 18 in each PLL 12, 14 compares that PLL's divided output signal I to the common reference signal A, and outputs a local phase error signal B. One comparison is performed at each reference signal period, so if the reference signal A is for example 200 MHz, a data stream of 200 million samples per second generated by each phase detector 18. By representing the phase detector output B in digital form, which is common in digital PLLs 12, 14, if bit errors are avoided the data can be transported across the IC without signal degradation. For further signal integrity, the local phase errors B, and the average phase error C transferred back to the PLLs 12, 14, could be transmitted with a parity bit or other error detection/correction, as known in the art, so long as the processing does not introduce significant delay. The phase error signals B from the phase detectors 18 in each participating PLL 12, 14 are transferred to the phase error averaging circuit 16, which calculates the average phase error C. This calculation is straightforward to implement, and can be performed with low power. For example, the phase error signals B from all participating phase detectors 18 are added together, and then the result is divided by the number of participating PLLs 12, 14 (N). If N is equal to a power of 2, say $N=2^M$, the division is particularly simple, and is performed by shifting by M bit positions to the right.

The average phase error signal C is used by both the common mode loop filter 20 and the difference mode loop filter 22 in each participating PLL 12, 14. The common mode loop filter 20 operates using only the average phase error C as input (as opposed to a conventional PLL, which uses the PLL's local phase error as input). The common mode loop filter 20 includes an integrator to achieve high low-frequency gain. The common mode loop filter 20 causes the average phase of all participating PLL outputs to closely track the phase of the common reference signal A. Where this is implemented as a digital filter, the integrator can be made ideal, with a pole at DC. The common mode loop filter 20 also has more transfer poles and zeros to shape the response and ensure stability. In each participating PLL 12, 14, the output E of the common mode loop filter 20 is (through a summation) input to the digitally controlled oscillator (DCO) 24. The output of the DCO 24 is then fed back, through the divider 26, to the phase detector 18, closing the feedback loop. The bandwidth of this loop is chosen rather low, so that the reference noise contribution at the outputs is minimized. This will occur by setting the bandwidth equal to the offset frequency where the equivalent reference noise at the output equals the phase noise of the combined oscillators 24, i.e. the noise of a single DCO 24 minus 10·log(N), where N is the number of DCOs 24 in participating PLLs 12, 14. The common mode loop filter 20 ensures that the frequency accuracy of the common reference signal A is achieved by all output signals H. However, the reference noise is not tracked to a higher frequency than necessary, and the common mode loop filter bandwidth is only wide enough for the DCOs 24 to provide sufficiently low common mode phase noise.

The difference mode loop filter 22 operates using the difference D between the average phase error C and the PLL's local phase error B. This ensures that the DCOs 24 behave as closely as possible as one oscillator, i.e., with output signal H differences suppressed. As indicated in FIG. 1, the average phase error C is subtracted from the PLL's local phase error B, and the result D is the input to the difference mode loop filter 22. The difference mode loop filter 22 is designed to have as wide a bandwidth as possible. Common practice for PLL bandwidth is not to exceed about $\frac{1}{10}$ of the reference frequency, which is a reasonable guideline. For example, if the reference frequency is 200 MHz, the bandwidth of the difference mode loop would be about 20 MHz. Up to that frequency, differences between the Controlled Oscillators 24 in different PLLs 12, 14 are suppressed, and the COs 24 behave as one. In particular, their uncorrelated phase noise is suppressed.

Hence, the two loop filters 20, 22 act together to cause all participating PLLs 12, 14 to track the phase of the common reference signal A. The common mode loop filter 20 forces the group of PLLs 12, 14 to track the reference, but there will be a spread, or variation, in phase among the outputs of the PLLs 12, 14. The difference mode loop filter 24 operates to minimize that spread, causing all of the PLLs 12, 14 to effectively operate as a single PLL.

In embodiments where different or adjustable phase relations are needed between the different PLL outputs, individual offsets are added digitally at the phase detector 18 outputs by an adder 19. When the PLLs achieve the desired phase shift (which is the negative of the added offset), the phase error signal will be zero. This causes the system 10 to lock with the outputs in different phase relations, but it will not alter the dynamics of the system 10, where the high bandwidth of the difference mode loops will establish the phase relations very quickly after a change. Accordingly, in these embodiments, for the selected PLLs 12, 14 with phase offsets, the adder 19 adds the negative of the desired phase offset to the output of the phase detector 18, to generate the local phase error signal B.

In one embodiment, the system 10 is implemented in the digital domain. In another embodiment, some parts of the PLLs 12, 14 are implemented in analog (e.g., one or both of the common mode loop filter 20 and the difference mode loop filter 22). However, the connection of PLL local phase error signals B to the phase error averaging circuit, and distribution of the average phase error C back to the PLLs 12, 14 is preferably implemented as digital signals, to minimize the risk of signal quality degradation in the transfer. These connections are made without using high frequency signals. This preserves a high degree of modularity in the system 10—that is, PLLs 12, 14 can be added to or removed from the system 10 without work-intensive changes of high frequency routing and buffering.

Figure 2:
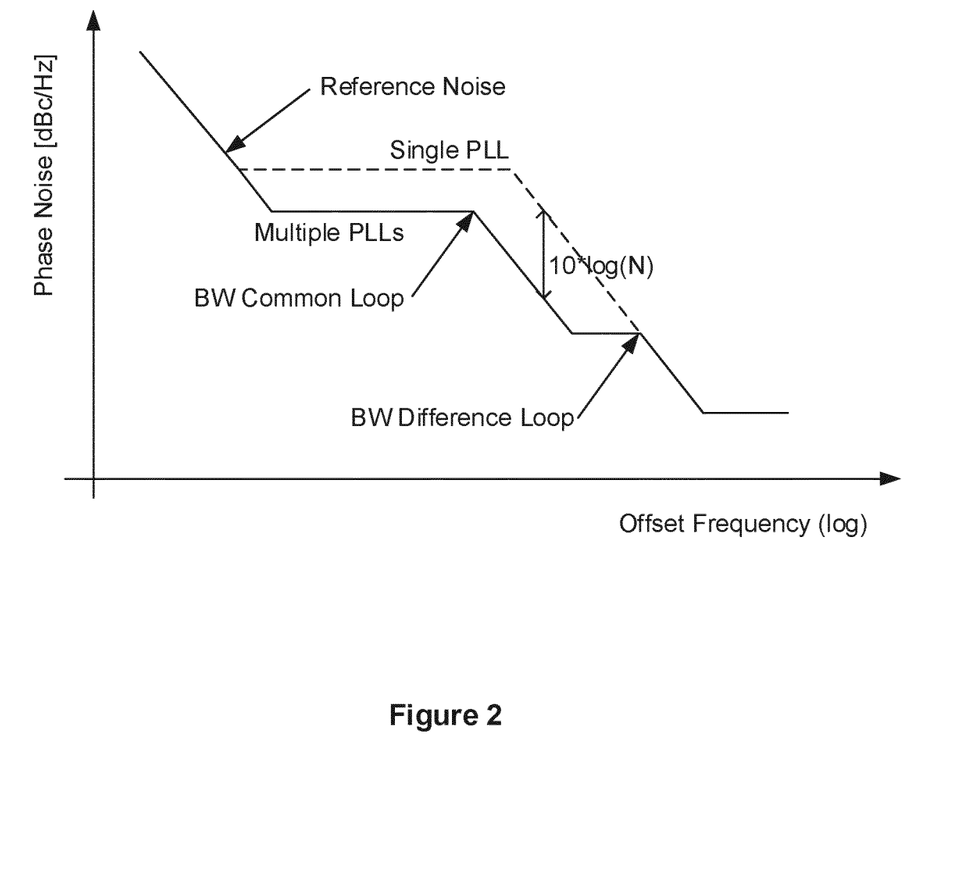
FIG. 2 is a single-sideband phase noise graph of conventional and inventive PLLs.

FIG. 2 is a single-sideband phase noise graph showing the phase noise (in dBc/Hz) as a function of offset frequency, for both a single PLL and an otherwise equivalent PLL that participates in the multi-PLL system 10 described herein. As FIG. 2 shows, the multi-PLL system 10 improves phase noise in both the in-band region and in the region dominated by oscillator noise. When the difference mode loop gain is high, the improvement in the oscillator dominated phase noise region is close to 10·log(N), since the different oscillators are then locked together to effectively behave as a single oscillator with N times the signal energy. The improvement in the in-band region results from the N PLLs 12, 14 effectively being parallel connected in the common mode loop, so that in-band noise sources will be averaged, reducing them by 10·log(N). In the example shown, the reference noise then becomes dominant, making the improvement less in the in-band region compared to the oscillator noise region. If the reference noise is not dominant, however, there can be equal improvement in both regions, of up to 10·log(N) dB.

Figure 3:
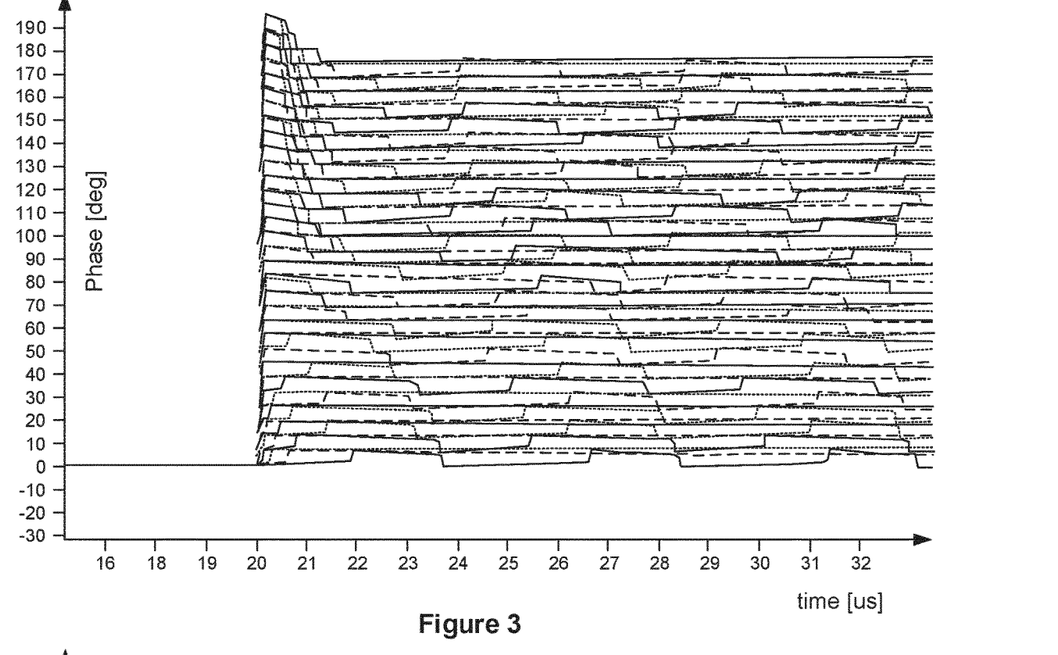
FIG. 3 is a graph showing differences in phase between conventional PLL outputs.
Figure 4:
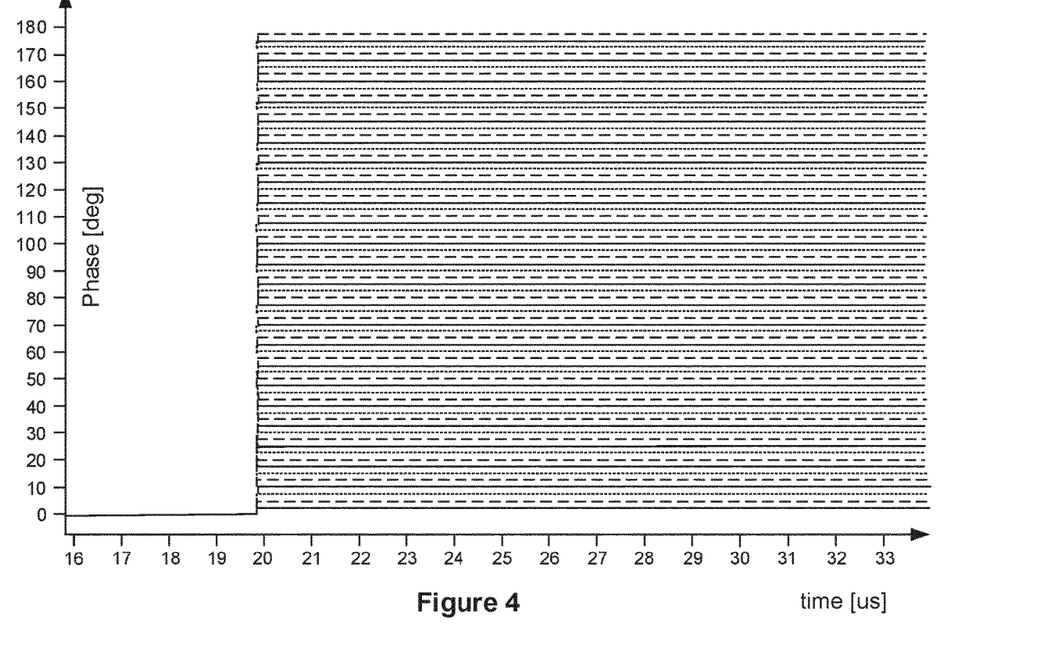
FIG. 4 is a graph showing the phase between inventive PLL outputs.

Phase-plane models of the multi-PLL system 10 with two PLLs (as depicted in FIG. 1), and two conventional PLLs, were constructed and simulated. Both models included equal, undesired oscillator coupling between the two PLLs. The closed loop transfer from common reference signal input to PLL output was made equal for the two models, with the only noise source being white noise applied to the common reference signal input. Phase steps were then applied to one of the loops of each model. The sizes of the steps were swept between 0 and 180 degrees. In the conventional PLL system, an undesired oscillator coupling of the magnitude applied, resulting in oscillation as shown in FIG. 3, which plots the difference in phase between the two PLL outputs. The corresponding phase step response applied to the model of the multi-PLL system 10 is shown in FIG. 4, where no oscillation is observed. These simulations demonstrate that the dual loop filter design and use of average phase error, as described herein, provides improved stability of a distributed LO-generation system, without sacrificing noise performance (which would be the result of simply increasing the PLL bandwidth of a conventional system with multiple PLLs). Additionally, due to the high bandwidth of the difference mode loop, the multi-PLL system 10 settles quickly following a frequency change.

Figure 5:
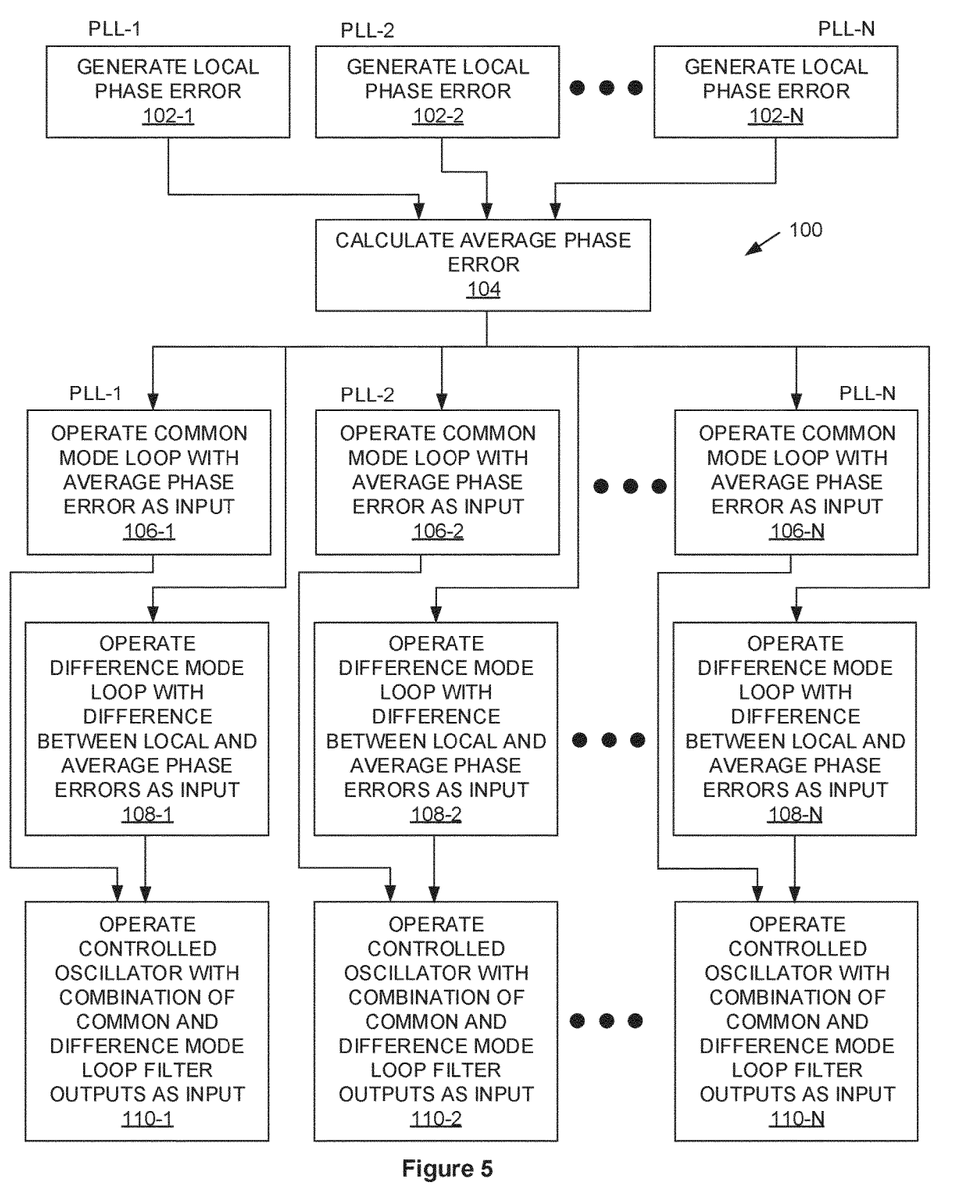
FIG. 5 is a flow diagram of a method of generating periodic signals using inventive PLLs.

FIG. 5 depicts a method 100 of generating a two or more periodic signals using two or more PLLs (PLL-1, PLL-2, PLL-N), implemented on an Integrated Circuit. Each PLL receives a common reference signal. At each PLL, a local phase error signal is generated (blocks 102-1, 102-2, ..., 102-N), indicating a phase error between the PLL output signal and the common reference signal. An average phase error is calculated from the local phase error signals (block 104). The average may be calculated, for example, at a phase error averaging circuit 16. The average phase error is distributed back to each PLL (PLL-1, PLL-2, PLL-N). At each PLL, a common mode loop filter 20 is operated, using the average phase error as input (blocks 106-1, 106-2, ..., 106-N). Simultaneously, a difference mode loop filter 22 is also operated at each PLL, with a difference between the local phase error and the average phase error as input (blocks 108-1, 108-2, ..., 108-N). A Controlled Oscillator 24 is further operated at each PLL, with a combination of the common mode loop filter 20 and difference mode loop filter 22 outputs as input (blocks 110-1, 110-2, ..., 110-N). The entire method (blocks 102, 104, 106, 108, 110) is repeated for every cycle of the common mode reference signal.

Figure 6A:
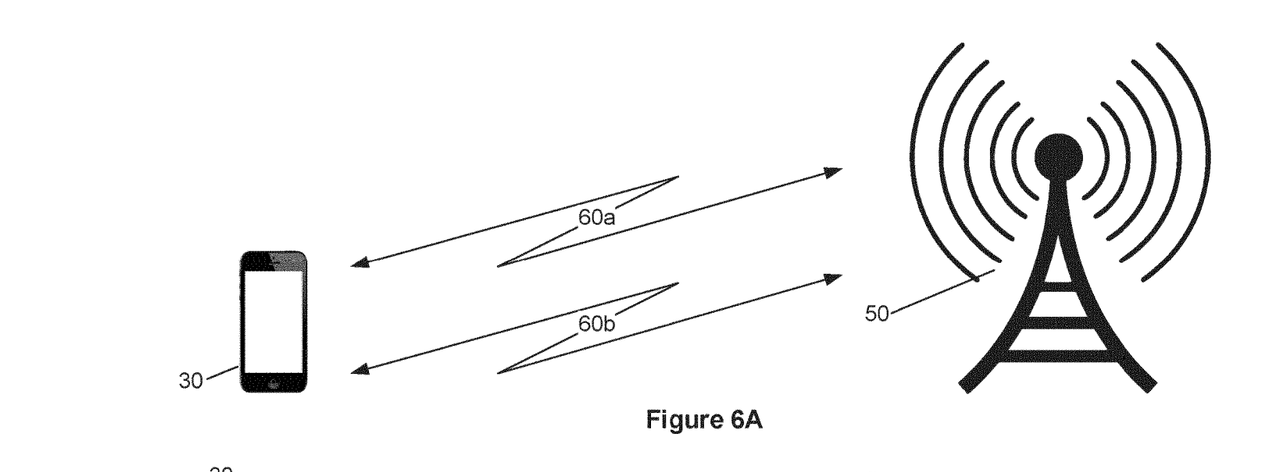
FIG. 6A is a diagram of MIMO transmission on the air interface of a wireless communication network.

FIG. 6A is a diagram of MIMO transmission over the air interface of a wireless communication network. A User Equipment (UE) 30, such as a smartphone, receives and transmits modulated Radio Frequency (RF) signals, over multiple antennas, from and to a base station 50, such as an LTE eNB or an NR gNB. The RF signals 60a, 60b employ spatial diversity and/or spatial multiplexing to increases robustness against fading or co-channel interference, and to improve bitrates, by transmitting on separate paths between respective multiple antennas at the UE 30 and base station 50. Although only two RF signals 60a, 60b are shown, in general MIMO transmissions may comprise multiple separate transmissions (e.g., 2, 4, 8, ..., 128, or more). At each of the UE 30 and base station 50, multiple transceivers, associated with the multiple antennas, receive and transmit RF signals. These transceivers require multiple phase-locked Local Oscillator (LO) signals for accurate frequency conversion. Additionally or alternatively, one or both of the UE 30 and base station 50 may implement beamforming, wherein the directionality of an antenna is increased and controlled by controlling the phase of multiple antenna beams transmitted or received by a phased array antenna. In this application also, multiple transceivers each require a phase-locked LO signal.

Figure 6B:
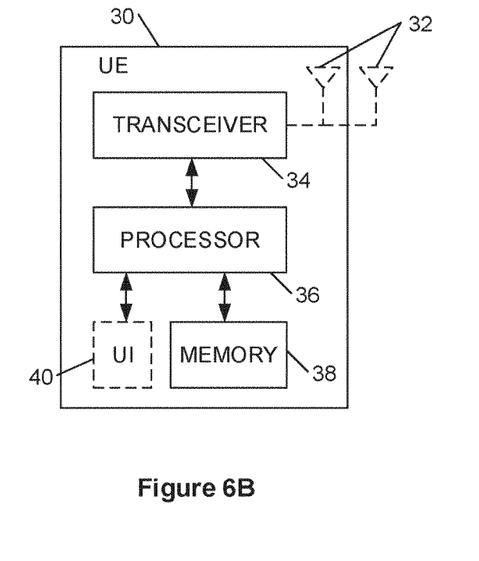
FIG. 6B is a block diagram of the UE of FIG. 6A.

FIG. 6B is a block diagram of the UE 30 of FIG. 6A. As used herein, the term UE may refer to a user-operated telephony terminal, a machine-to-machine (M2M) device, a machine-type communications (MTC) device, a Narrowband Internet of Things (NB-IoT) device (in particular a UE implementing the 3GPP standard for NB-IoT), etc. A UE 30 may also be referred to as a radio device, a radio communication device, a wireless communication device, a wireless terminal, or simply a terminal—unless the context indicates otherwise, the use of any of these terms is intended to include device-to-device UEs or devices, machine-type devices or devices capable of machine-to-machine communication, sensors equipped with a radio network device, wireless-enabled table computers, mobile terminals, smartphones, laptop-embedded equipped (LEE), laptop-mounted equipment (LME), USB dongles, wireless customer-premises equipment (CPE), and the like.

The UE 30 transmits and receives RF signals (including MIMO signals) on at least one antenna 32, which may be internal or external, as indicated by dashed lines. The RF signals are generated, and received, by one or more transceiver circuits 34. The transceiver circuits 34, as well as other components of the UE 30, are controlled by processing circuitry 36. Memory 38 operatively connected to the processing circuitry 36 stores software in the form of computer instructions operative to cause the processing circuitry 36 to execute the method 100 described herein. A user interface 40 may include output devices such as a display and speakers (and/or a wired or wireless connection to audio devices such as ear buds), and/or input devices such as buttons, a keypad, a touchscreen, and the like. As indicated by the dashed lines, the user interface 40 may not be present in all UEs 30; for example, UEs 30 designed for Machine Type Communications (MTC) such as Internet of Things (IoT) devices, may perform dedicated functions such as sensing/measuring, monitoring, meter reading, and the like, and may not have any user interface 40 features.

Figure 6C:
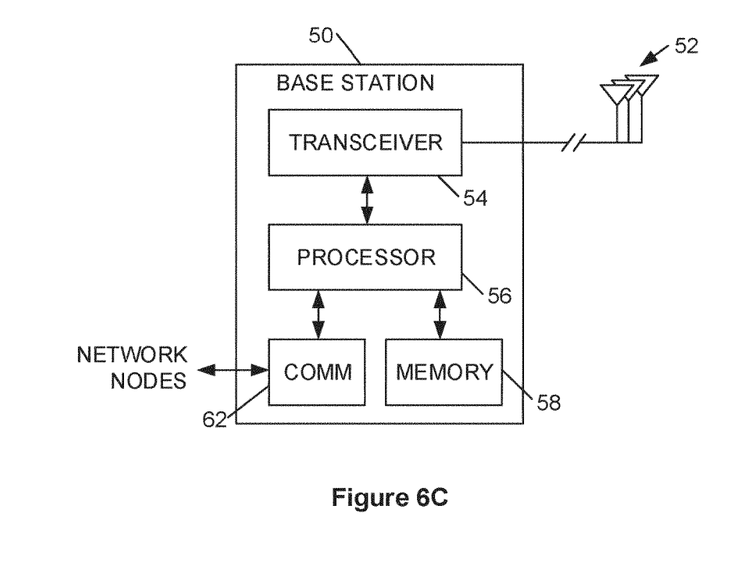
FIG. 6C is a block diagram of the base station of FIG. 6A.

FIG. 6C is a block diagram of the base station 50 of FIG. 6A. A base station 50—known in various network implementations as a Radio Base Station (RBS), Base Transceiver Station (BTS), Node B (NB), enhanced Node B (eNB), Next Generation Node B (gNB), or the like—is a node of a wireless communication network that implements a Radio Access Network (RAN) in a defined geographic area called a cell, by providing radio transceivers to communicate wirelessly with a plurality of UEs 30.

The base station 50 transmits and receives RF signals (including MIMO signals) on a plurality of antennas 52. As indicated by the broken line, the antennas 52 may be located remotely from the base station 50, such as on a tower or building. The RF signals are generated, and received, by one or more transceiver circuits 54. The transceiver circuits 54, as well as other components of the base station 50, are controlled by processing circuitry 56. Memory 58 operatively connected to the processing circuitry 56 stores instructions operative to cause the processing circuitry 56 to execute the method 100 described herein. Although the memory 58 is depicted as being separate from the processing circuitry 56, those of skill in the art understand that the processing circuitry 56 includes internal memory, such as a cache memory or register file. Those of skill in the art additionally understand that virtualization techniques allow some functions nominally executed by the processing circuitry 56 to actually be executed by other hardware, perhaps remotely located (e.g., in the so-called "cloud"). Communication circuitry 62 provides one or more communication links to one or more other network nodes, propagating communications to and from UEs 30, from and to other network nodes or other networks, such as telephony networks or the Internet.

In all embodiments, the processing circuitry 36, 56 may comprise any sequential state machine operative to execute machine instructions stored as machine-readable computer programs in memory 38, 58, such as one or more hardware-implemented state machines (e.g., in discrete logic, FPGA, ASIC, etc.); programmable logic together with appropriate firmware; one or more stored-program, general-purpose processors, such as a microprocessor or Digital Signal Processor (DSP), together with appropriate software; or any combination of the above.

In all embodiments, the memory 38, 58 may comprise any non-transitory machine-readable media known in the art or that may be developed, including but not limited to magnetic media (e.g., floppy disc, hard disc drive, etc.), optical media (e.g., CD-ROM, DVD-ROM, etc.), solid state media (e.g., SRAM, DRAM, DDRAM, ROM, PROM, EPROM, Flash memory, solid state disc, etc.), or the like.

In all embodiments, the transceiver circuits 34, 54 are operative to communicate with one or more other transceivers via a Radio Access Network (RAN) according to one or more communication protocols known in the art or that may be developed, such as IEEE 802.xx, CDMA, WCDMA, GSM, LTE, UTRAN, WiMax, NB-IoT, or the like. The transceiver 34, 54 implements transmitter and receiver functionality appropriate to the RAN links (e.g., frequency allocations and the like). The transmitter and receiver functions may share circuit components and/or software, or alternatively may be implemented separately.

In all embodiments, the communication circuitry 62 may comprise a receiver and transmitter interface used to communicate with one or more other nodes over a communication network according to one or more communication protocols known in the art or that may be developed, such as Ethernet, TCP/IP, SONET, ATM, IMS, SIP, or the like. The communication circuits 62 implement receiver and transmitter functionality appropriate to the communication network links (e.g., optical, electrical, and the like). The transmitter and receiver functions may share circuit components and/or software, or alternatively may be implemented separately.

Figure 7:
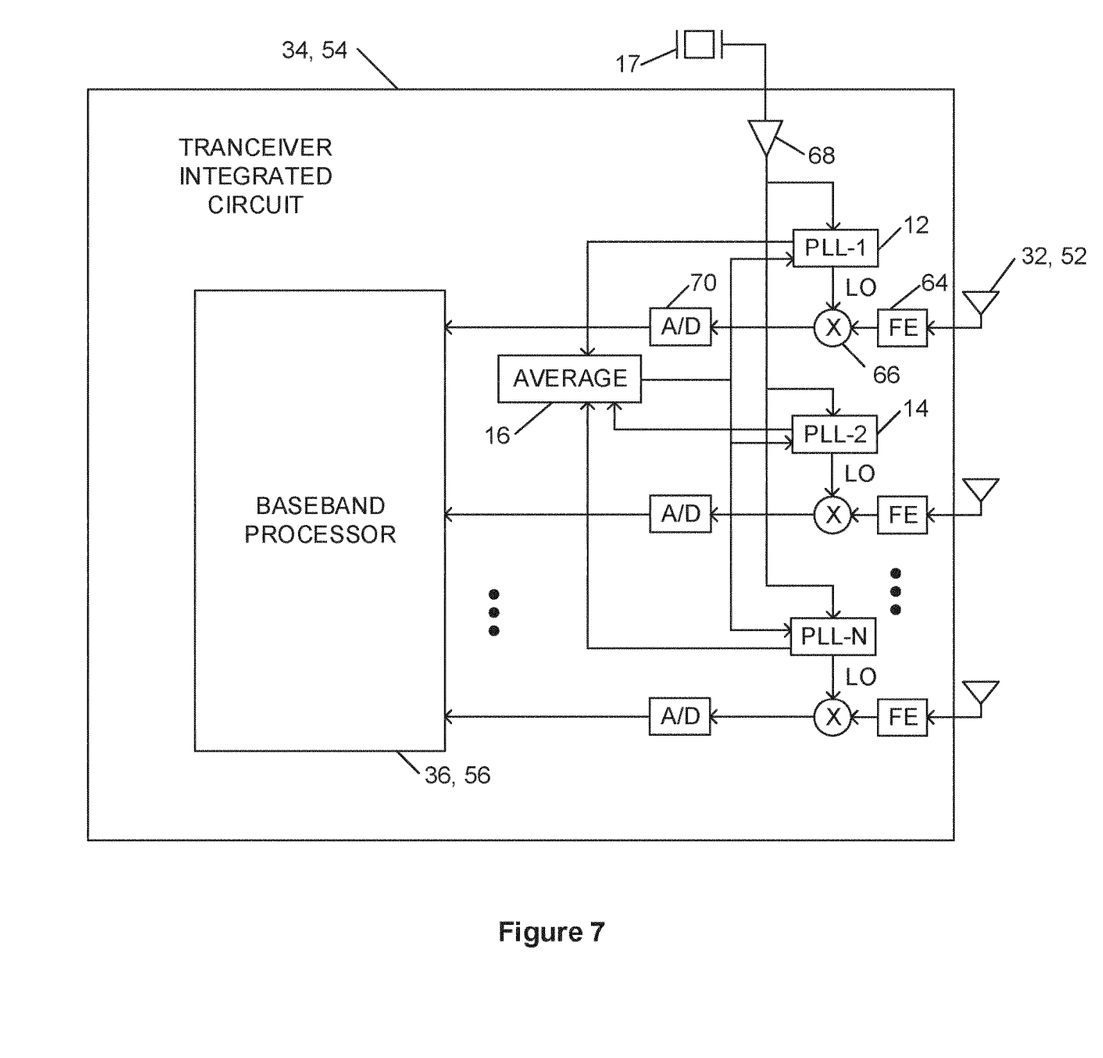
FIG. 7 is a block diagram of some receiver components of a transceiver integrated circuit.

FIG. 7 depicts some receiver circuitry of a transceiver 34, 54 implemented on an Integrated Circuit (IC) in the UE 30 or base station 50 of FIG. 6, respectively. For simplicity, transmission circuits are not depicted. RF signals received at each of a plurality of antennas 32, 52 are processed by RF Front End (FE) circuitry 64, which may for example include Low Noise Amplification, filtering, and the like. The received signals are frequency downconverted by mixing with a Local Oscillator (LO) signal at a mixer 66, and digitized at Analog-to-Digital converters 70. The downconverted digital signals are then processed by baseband processor 36, 56.

The LO signals at each mixer 66 are preferably phase locked for efficient, low power processing of received signals, and for the transmission of coherent signals from multiple antennas. According to embodiments of the present invention, this is ensured by a multi-PLL system 10 of LO generation. The multi-PLL system 10 comprises two or more Phase Locked Loops PLL-1 12, PLL-2 14, . . . , PLL-N, and a phase error averaging circuit 16. As described with respect to FIG. 1, each PLL 12, 14 receives a common reference signal, such as a clock signal generated by a crystal oscillator 17. A distribution network, represented by a buffer 68, distributes the same common reference signal to each PLL 12, 14. Each PLL 12, 14 outputs both the LO output signal and a local phase error signal indicating a phase error between the LO signal and the common reference signal. The local phase error signal from each PLL 12, 14 (which is preferably a digital signal) is provided to the phase error averaging circuit 16.

The phase error averaging circuit 16 receives a local phase error signal from each of a plurality of the PLLs 12, 14, and generates and outputs the average of all received phase error signals. The average phase error signal is provided to each participating PLL 12, 14.

As depicted in FIG. 1, each PLL 12, 14 includes a Controlled Oscillator (CO) 24 configured to generate the LO signal in response to a CO control input; a common mode loop filter 20 configured to generate a common mode CO control signal based on the average phase error signal; and a difference mode loop filter 22 configured to generate a difference mode CO control signal based on a difference between the PLL's local phase error signal and the average phase error signal. The CO control input is a combination of the common mode CO control signal and the difference mode CO control signal.

The two loop filters 20, 22 operate together to lock each PLL output to the common reference signal. The common mode loop filter 20 phase locks the group of PLL outputs to the common reference signal, but with variations between PLLs 12, 14. By using a difference between each PLL's local phase error and the average phase error as input to the difference mode loop filter 22 (and because the difference mode loop filter 22 has a higher bandwidth than the common mode loop filter 20), these phase differences between different PLL outputs are suppressed, and all PLLs (PLL-1, PLL-2, . . . PLL-N) essentially operate as one.

The multiple-PLL system 10 is described herein with all PLLs 12, 14 in the system (which may comprise all PLLs on an IC) participating—that is, both sending their local phase error signal to the phase error averaging circuit 16, and receiving the average phase error from the phase error averaging circuit 16. However, this is not a requirement of embodiments of the present invention. For example, one or more PLLs on the IC may not participate in the phase error averaging process at all. Alternatively, one or more PLLs 12, 14 may receive the average phase error but not contribute an individual phase error to the average calculation, or may send their local phase error signal to the phase error averaging circuit 16 but not receive the average phase error. So long as two or more PLLs 12, 14 participate in the phase error averaging operation of the multi-PLL system 10 described herein, however, at least some benefits of the present invention accrue.

Embodiments of the present invention present numerous advantages over the prior art. A distributed LO generation with local PLLs and routing of a lower frequency reference signal is attractive for power consumption, and the localized high frequency provides attractive modularity of the design. Using the proposed solution, the PLLs in such a distributed LO generation can be locked to each other with high bandwidth, without sacrificing the design modularity, which reduces phase noise, and reduces the effects of potential undesired oscillator coupling. The bandwidth of the reference tracking can be set independently, allowing optimization of the phase noise performance without sacrificing suppression of oscillator coupling effects. The technique can be based on digital PLLs, where the local phase errors are available in digital form. The signals can then be transported without errors to a central location, where the average phase error can easily be calculated and be made available to the PLLs. The technique only requires minor hardware additions to conventional designs, and all in the digital domain. Embodiments of the present invention reduce the effects of oscillator interaction, and reduce phase noise, both in-band and out-of-band. The additional circuitry is digital and of low complexity. Embodiments of the invention do not require high frequency signal distribution, which preserves design modularity and avoids high power consumption. The phase relation settles quickly between outputs.

As used herein, the term "configured to" means set up, organized, adapted, or arranged to operate in a particular way; the term is synonymous with "designed to."

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A multi-PLL system implemented on an Integrated Circuit, comprising:
    two or more Phase Locked Loop (PLL) circuits, each configured to receive a common reference signal and to output both an output signal and a local phase error signal, and each comprising
        a Controlled Oscillator (CO) configured to generate the output signal in response to a CO control input signal;
        a phase detector configured to generate the local phase error signal by comparing the phase of the output signal or a divided output signal and the common reference signal;
        a common mode loop filter configured to generate a common mode CO control signal based on an average phase error of a plurality PLLs; and
        a difference mode loop filter configured to generate a difference mode CO control signal based on a difference between the PLL's local phase error signal and the average phase error of a plurality of PLLs;
        wherein the CO control input signal is a combination of the common mode CO control signal and the difference mode CO control signal; and
    a phase error averaging circuit configured to
        receive local phase error signals from a plurality of PLLs;
        calculate an average phase error of the plurality of PLLs; and
        output the average phase error to the two or more PLLs.

2. The system of claim 1 wherein the combination of the common mode CO control signal and the difference mode CO control signal is the sum of the common mode CO control signal and the difference mode CO control signal.

3. The system of claim 1 wherein the Controlled Oscillator is a Digital Controlled Oscillator, and wherein the phase error signals are digital signals.

4. The system of claim 1 wherein the common mode loop filter has a first bandwidth, and wherein the difference mode loop filter has a second bandwidth greater than the first bandwidth.

5. The system of claim 1 wherein each common mode loop filter forces the associated PLL to track the phase of the common reference signal.

6. The system of claim 1 wherein each difference mode loop filter suppresses phase differences between the output of the associated PLL and other PLLs in the system.

7. The system of claim 1 wherein the plurality of PLLs from which the average phase error signal is calculated comprises all of the two or more PLLs receiving the average phase error signal.

8. The system of claim 1 wherein one or more PLLs has a phase offset relative to the others, and further comprises:
    an adder operatively connected to the output of the phase detector, and operative to add to the output of the phase detector the negative of a desired phase offset, to generate the local phase error signal.

9. A method of generating two or more periodic signals using two or more Phase Locked Loops (PLL) implemented on an Integrated Circuit, each PLL receiving a common reference signal, the method comprising:
    generating a local phase error signal at each PLL indicating a phase error between the PLL output signal or a divided output signal and the common reference signal;
    averaging the local phase error signals from a plurality of PLLs to generate an average phase error; and
    at each of the two or more PLLs,
        operating a common mode loop filter with the average phase error as input, to generate a common mode Controlled Oscillator (CO) control signal;
        operating a difference mode loop filter with a difference between the PLL's local phase error signal and the average phase error as input, to generate a difference mode CO control signal; and
        operating a CO, with a combination of the common mode CO control signal and the difference mode CO control signal as a CO control input signal, to generate an output signal.

10. The method of claim 9 wherein averaging the phase error signals from a plurality of PLLs comprises, at a phase error averaging circuit:
    receiving phase error signals from a plurality PLLs
    calculating an average phase error of the plurality of PLLs; and
    outputting the average phase error to two or more PLLs.

11. The method of claim 9 wherein at least the plurality of phase error signals and the average phase error are digital signals.

12. The method of claim 9 wherein the combination of the common mode CO control signal and the difference mode CO control signal is the sum of the common mode CO control signal and the difference mode CO control signal.

13. The method of claim 9 wherein the common mode loop filter has a first bandwidth, and wherein the difference mode loop filter has a second bandwidth greater than the first bandwidth.

14. The method of claim 9 wherein each common mode loop filter forces the associated PLL to track the phase of the common reference signal.

15. The method of claim 9 wherein each difference mode loop filter suppresses phase differences between the output of the associate PLL and other PLLs in the plurality.

16. The method of claim 9 wherein the plurality of PLLs from which the average phase error signal is calculated comprises all of the two or more PLLs receiving the average phase error signal.

17. The method of claim 9 wherein one or more PLLs has a phase offset relative to the others, wherein generating a local phase error signal at a PLL further comprises adding the negative of a desired phase offset to the phase difference between the PLL output signal or a divided output signal and the common reference signal, to generate the local phase error signal.

18. A base station operative in a wireless communication network, the base station including one or more transceiver circuits comprising:
    two or more Phase Locked Loop (PLL) circuits, each configured to receive a common reference signal and to output both an output signal and a local phase error signal, and each comprising
        a Controlled Oscillator (CO) configured to generate the output signal in response to a CO control input;
        a phase detector configured to generate the local phase error signal by comparing the phase of the output signal or a divided output signal and the common reference signal;

a common mode loop filter configured to generate a common mode CO control signal based on an average phase error of a plurality PLLs; and a difference mode loop filter configured to generate a difference mode CO control signal based on a difference between the PLL's local phase error signal and the average phase error of a plurality PLLs;

wherein the CO control input is a combination of the common mode CO control signal and the difference mode CO control signal; and a phase error averaging circuit configured to
receive local phase error signals from a plurality PLLs;
calculate an average phase error of the plurality of PLLs; and
output the average phase error to two or more PLLs.

19. User Equipment (UE) operative in a wireless communication network, the UE including one or more transceiver circuits comprising:

two or more Phase Locked Loop (PLL) circuits, each configured to receive a common reference signal and to output both an output signal and a local phase error signal, and each comprising a Controlled Oscillator (CO) configured to generate the output signal in response to a CO control input signal;

a phase detector configured to generate the local phase error signal by comparing the phase of the output signal or a divided output signal and the common reference signal;

a common mode loop filter configured to generate a common mode CO control signal based on an average phase error of a plurality PLLs; and a difference mode loop filter configured to generate a difference mode CO control signal based on a difference between the PLL's local phase error signal and the average phase error of a plurality PLLs;

wherein the CO control input is a combination of the common mode CO control signal and the difference mode CO control signal; and a phase error averaging circuit configured to
receive local phase error signals from a plurality PLLs;
calculate an average phase error of the plurality of PLLs; and
output the average phase error to the two or more PLLs.

* * * * *